(12) United States Patent
Price et al.

(10) Patent No.: US 12,148,592 B2
(45) Date of Patent: Nov. 19, 2024

(54) SYSTEMS AND METHODS FOR ELECTRON BEAM FOCUSING IN ELECTRON BEAM ADDITIVE MANUFACTURING

(71) Applicant: General Electric Company, Schenectady, NY (US)

(72) Inventors: John Scott Price, Niskayuna, NY (US); Ye Bai, Niskayuna, NY (US); Antonio Caiafa, Schenectady, NY (US); Vasile Bogdan Neculaes, Niskayuna, NY (US); Uwe Wiedmann, Clifton Park, NY (US)

(73) Assignee: General Electric Company, Evendale, OH (US)

( * ) Notice: Subject to any disclaimer, the term of this patent is extended or adjusted under 35 U.S.C. 154(b) by 0 days.

(21) Appl. No.: 18/497,508

(22) Filed: Oct. 30, 2023

(65) Prior Publication Data

US 2024/0062983 A1 Feb. 22, 2024

Related U.S. Application Data

(62) Division of application No. 16/944,836, filed on Jul. 31, 2020, now Pat. No. 11,837,428.

(51) Int. Cl.
*H01J 29/68* (2006.01)
*B29C 64/153* (2017.01)
(Continued)

(52) U.S. Cl.
CPC ............ *H01J 29/68* (2013.01); *B29C 64/153* (2017.08); *B29C 64/273* (2017.08);
(Continued)

(58) Field of Classification Search
CPC ...... H01J 29/68; H01J 37/3002; H01J 37/305; H01J 2237/1415; B29C 64/152; B29C 64/273
See application file for complete search history.

(56) References Cited

U.S. PATENT DOCUMENTS

| 5,717,371 A | 2/1998 | Crow |
| 5,748,063 A | 5/1998 | Crow |

(Continued)

FOREIGN PATENT DOCUMENTS

| CN | 103037608 A | 4/2013 |
| CN | 103367080 A | 10/2013 |

(Continued)

OTHER PUBLICATIONS

Lim et al., "Adjustable, Short Focal Length Permanent-Magnet Quadrupole Based Electron Beam Final Focus System", Physical review accelerators and beams, vol. 08, Issue: 07, pp. 072401-1 to 072401-17, Jul. 15, 2005.

(Continued)

*Primary Examiner* — Joseph L Williams
(74) *Attorney, Agent, or Firm* — Dinsmore & Shohl LLP

(57) ABSTRACT

A system for melting, sintering, or heat treating a material is provided. The system includes a cathode, an anode, and a focus coil assembly having a quadrupole magnet. The quadrupole magnet includes four poles and a yoke. The four poles are spaced apart and surround a beam cavity. Each of the four poles includes a pole face proximate the beam cavity and an end opposite the pole face. The first and third poles are aligned along an x-axis and configured to have a first magnetic polarity at their respective pole faces and a second magnetic polarity opposite the first magnetic polarity at their respective ends. The second and fourth poles are aligned along a y-axis and configured to have the second magnetic polarity at their respective pole faces and the first magnetic polarity at their respective ends. The yoke surrounds the poles and is coupled to the poles.

20 Claims, 13 Drawing Sheets

(51) Int. Cl.
  *B29C 64/273* (2017.01)
  *H01J 37/30* (2006.01)
  *H01J 37/305* (2006.01)
  *B33Y 30/00* (2015.01)

(52) U.S. Cl.
  CPC ........ *H01J 37/3002* (2013.01); *H01J 37/305* (2013.01); *B33Y 30/00* (2014.12); *H01J 2237/1415* (2013.01)

(56) References Cited

U.S. PATENT DOCUMENTS

| | | |
|---|---|---|
| 8,510,932 B2 | 8/2013 | Meinke |
| 8,625,743 B1 | 1/2014 | Caiafa |
| 8,712,015 B2 | 4/2014 | Caiafa |
| 9,153,409 B2 | 10/2015 | Wiedmann et al. |
| 10,008,359 B2 | 6/2018 | Canfield et al. |
| 2010/0207551 A1 | 8/2010 | Kazakov et al. |
| 2015/0110251 A1 | 4/2015 | Wiedmann et al. |
| 2016/0358741 A1 | 12/2016 | Schultz et al. |
| 2019/0104606 A1 | 4/2019 | Rosenzweig et al. |
| 2020/0203113 A1 | 6/2020 | Ponard |

FOREIGN PATENT DOCUMENTS

| | | |
|---|---|---|
| CN | 107408481 A | 11/2017 |
| CN | 110177421 A | 8/2019 |
| EP | 1246513 A2 | 10/2002 |
| JP | H06060840 A | 3/1994 |
| JP | H09199053 A | 7/1997 |
| TW | 200908057 A | 2/2009 |
| WO | 2020094261 A1 | 5/2020 |

OTHER PUBLICATIONS

Wiebe et al., "Performance of Plastic Electron Optics Components Fabricated Using a 3D Printer", Ultramicroscopy, vol. 205, pp. 70-74, Oct. 2019.

Extended European Search Report for EP Application No. 21182281.2 dated Jan. 4, 2022 (10 pages).

Chahine G et al: "The design and production of Ti-6Al-4V ELI customized dental implants", JOM: Journal of Metals, Springer New York LLC, United States, vol. 60, No. 11, Nov. 1, 2008 (Nov. 1, 2008), pp. 50-55, XP001520016, ISSN: 1047-4838, DOI: 10.1007/S11837-008-0148-2.

Azhirnian Armin et al: "Modeling and Analysis of Aberrations in Electron Beam Melting (EBM) Systems Master's thesis in Complex Adaptive Systems and Applied Physics", Jun. 1, 2017 (Jun. 1, 2017), pp. 1-60, XP055873985, Gothenburg, Sweden.

Chinese Office Action for Application No. 202110865814.1 dated Jun. 13, 2024 (31 pages with English Translation).

SYSTEMS AND METHODS FOR ELECTRON BEAM FOCUSING IN ELECTRON BEAM ADDITIVE MANUFACTURING

CROSS-REFERENCE TO RELATED APPLICATIONS

The present specification is a divisional of U.S. patent application Ser. No. 16/944,836 filed Jul. 31, 2020 and entitled "Systems and Methods for Electron Beam Focusing in Electron Beam Additive Manufacturing," now U.S. Pat. No. 11,837,428 issued Dec. 5, 2023, the entirety of which is incorporated by reference herein.

BACKGROUND

The field of the disclosure relates generally to systems and methods of electron beam additive manufacturing, and more particularly, to systems and methods of focusing and steering an electron beam using a focus coil assembly having a quadrupole magnet in an electron beam additive manufacturing system.

Electron beam additive manufacturing or electron-beam melting (EBM) is a type of additive manufacturing or 3D printing, for metal parts. In EBM, an electron beam is used as a heating source to fuse raw material, such as metal powder or wire, under a vacuum. The electron beam is controlled by a focus coil assembly, which focuses the electron beam with a magnetic field such that the electron beam has a profile with a desired diameter and shape. However, the magnetic field may extend beyond the focus coil assembly, causing a stray field that affects the electron beam after exiting from the focus coil assembly.

At least some known focus coil assemblies are prone to certain problems, and improvements in focus coil assemblies are desirable.

BRIEF DESCRIPTION

In one aspect, a system for melting, sintering, or heat treating a material is provided. The system includes a cathode, an anode, and a focus coil assembly. The cathode and the anode are configured to generate an electron beam. The focus coil assembly includes a quadrupole magnet. The quadrupole magnet includes first, second, third, and fourth poles and a yoke. The first, second, third, and fourth poles are spaced apart from each other and surround a beam cavity through which the electron beam travels. Each of the first, second, third, and fourth poles includes a pole face proximate the beam cavity and an end opposite the pole face. The first and third poles are aligned along an x-axis and configured to have a first magnetic polarity at their respective pole faces and a second magnetic polarity opposite the first magnetic polarity at their respective ends. The second and fourth poles are aligned along a y-axis and configured to have the second magnetic polarity at their respective pole faces and the first magnetic polarity at their respective ends. The x-axis is perpendicular to the y-axis. The yoke surrounds the first, second, third, and fourth poles and is coupled to the first, second, third, and fourth poles at the ends of the first, second, third, and fourth poles.

In another aspect, a focus coil assembly for melting, sintering, or heat treating a material is provided. The focus coil assembly includes a quadrupole magnet. The quadrupole magnet includes first, second, third, and fourth poles and a yoke. The first, second, third, and fourth poles are spaced apart from each other, and surround a beam cavity through which the electron beam travels. Each of the first, second, third, and fourth poles includes a pole face proximate the beam cavity and an end opposite the pole face. The first and third poles are aligned along an x-axis and configured to have a first magnetic polarity at their respective pole faces and a second magnetic polarity opposite the first magnetic polarity at their respective ends. The second and fourth poles are aligned along a y-axis and configured to have the second magnetic polarity at their respective pole faces and the first magnetic polarity at their respective ends. The x-axis is perpendicular to the y-axis. The yoke surrounds the first, second, third, and fourth poles and is coupled to the first, second, third, and fourth poles at the ends of the first, second, third, and fourth poles.

In yet another aspect, a deflection coil for electron beam additive manufacturing is provided. The deflection coil includes a quadrupole magnet. The quadrupole magnet includes first, second, third, and fourth poles and a yoke. The first, second, third, and fourth poles are spaced apart from each other, and surround a beam cavity through which electron beam travels. Each of the first, second, third, and fourth poles has a pole face proximate the beam cavity and an end opposite the pole face. The first and third poles are aligned along an x-axis, the second and fourth poles aligned along a y-axis. The x-axis is perpendicular to the y-axis. The yoke surrounds the first, second, third, and fourth poles and is coupled to the first, second, third, and fourth poles at the ends of the first, second, third, and fourth poles. The quadrupole magnet is configured to generate a dipole magnetic field.

DETAILED DESCRIPTION

The disclosure includes systems and methods of focusing and steering an electron beam for an electron beam additive manufacturing or electron beam melting (EBM) system. In an EBM system, a focus coil assembly is used to focus the electron beam to have a profile with a diameter and shape. As used herein, the profile of the electron beam refers to the cross-sectional profile of the electron beam. In some embodiments, the profile may be elliptical. In other embodiments, the profile may be circular (e.g., for fusing raw material). Further, a focus coil assembly is used to reduce a stray magnetic field, because any stray magnetic field outside of the focus coil assembly may affect the profile and travel direction of the electron beam. The focus coil assemblies disclosed herein include quadrupole magnets having a yoke and result in a reduced stray field, compared to at least some known focus coil assemblies. In the embodiments described herein, electron beam additive manufacturing is used as an example. The systems disclosed herein may be applied in any system that uses electron beams to melt, sinter, and/or heat treat materials such as metal.

Figure 1:
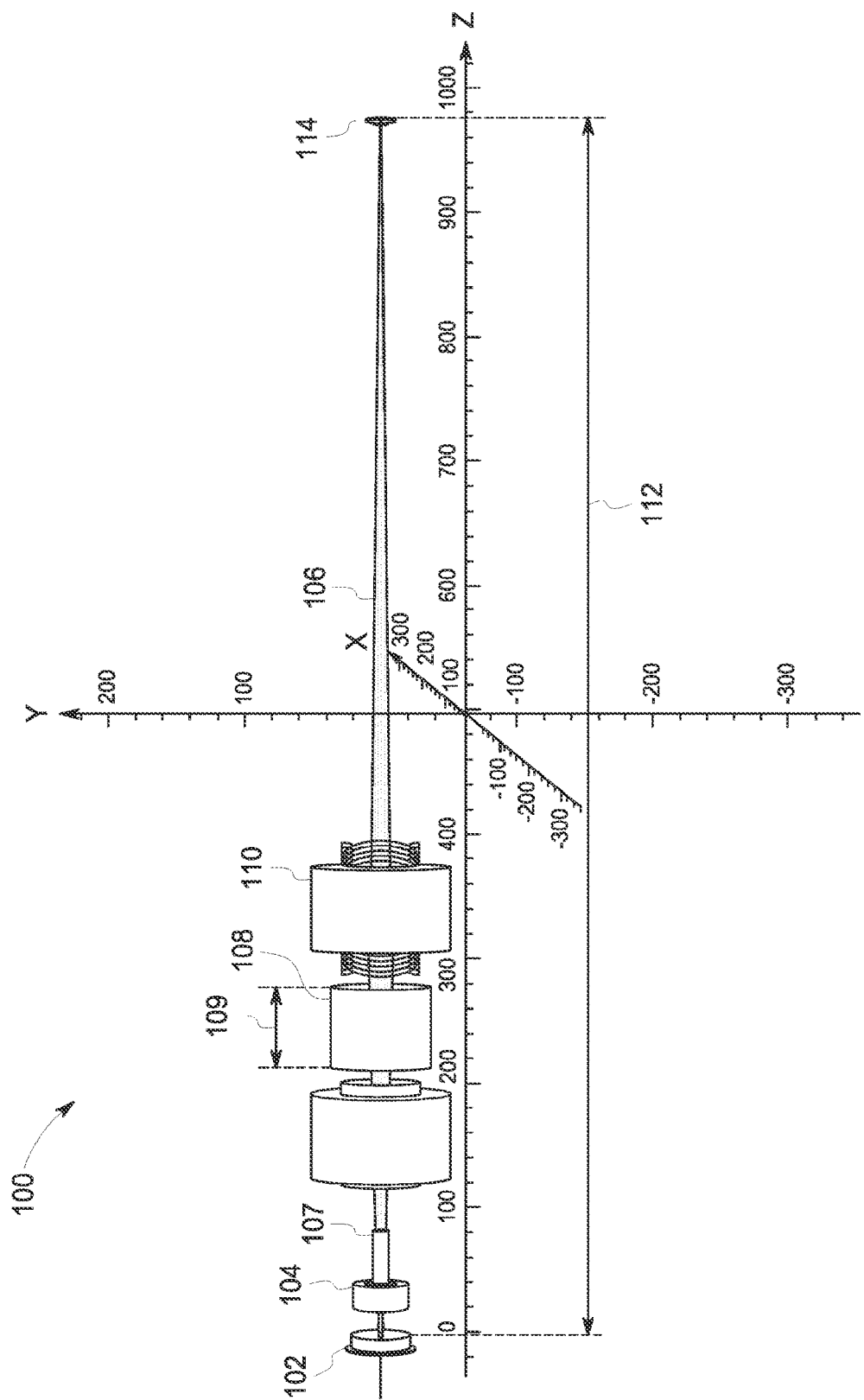
FIG. 1 is a schematic diagram of a known electron beam additive manufacturing or electron beam melting (EBM) system.

FIG. 1 is a schematic diagram of a known EBM system 100. The system 100 includes a cathode 102 and an anode 104. The cathode 102 and the anode 104 together are configured to generate an electron beam 106. The cathode 102 is heated to generate the electron beam 106. A voltage difference between the cathode 102 and the anode 104 accelerates the electron beam 106 away from the cathode 102 and towards the anode 104. The anode 104 may further include a beam tunnel 107, along which the electron beam 106 travels. Throughout this disclosure, the axis along which the electron beam 106 travels is denoted as a z-axis, and a plane substantially perpendicular to the z-axis is denoted as an x-y plane with an x-axis substantially perpendicular to a y-axis.

The system 100 further includes a focus coil assembly 108. The focus coil assembly 108 includes a solenoid magnet for focusing the electron beam 106. The solenoid magnet includes wires that wind around an air-core and generate a magnetic field by conducting electricity through the wires. A length 109 of the focus coil assembly 108 along the z-axis is approximately 100 mm, when the focal length is 750 mm for focusing an electron beam having energy of 60 kilo-electronvolt (keV) with an operation current of 3 Ampere (A) provided to the wires. A focal length is the distance along the z-axis from an end of the focal coil assembly proximate to the anode 104 to a focus produced at a build plate (e.g., at a focused position 114). The focus coil assembly 108 produces a large amount of stray magnetic field outside of the space that the electron beam 106 travels through. The system 100 further includes a deflection coil 110 configured to steer the electron beam 106 in a certain direction to enter a vacuum chamber (not shown) where parts are manufactured using the EBM process with the electron beam 106 heating raw material and fusing the heated raw material together. The distance 112 the electron beam 106 travels is approximately 1000 millimeter (mm) from the cathode 102 to a focused position 114 of the electron beam 106 in the vacuum chamber. Accordingly, the system 100 generally has a length at least greater than 1000 mm along the z-axis. With this relatively large size, increasing the energy of the electron beam 106 is difficult because the number of windings and the amplitude of the current need to be significantly increased, and as a result a current amplifier of the system may need to be redesigned to meet these demands. The system 100 is also susceptible to external magnetic fields, which may result in manufacturing imperfections such as unplanned electron beam anomalies, beam excursions, and beam displacements.

Figure 2A:
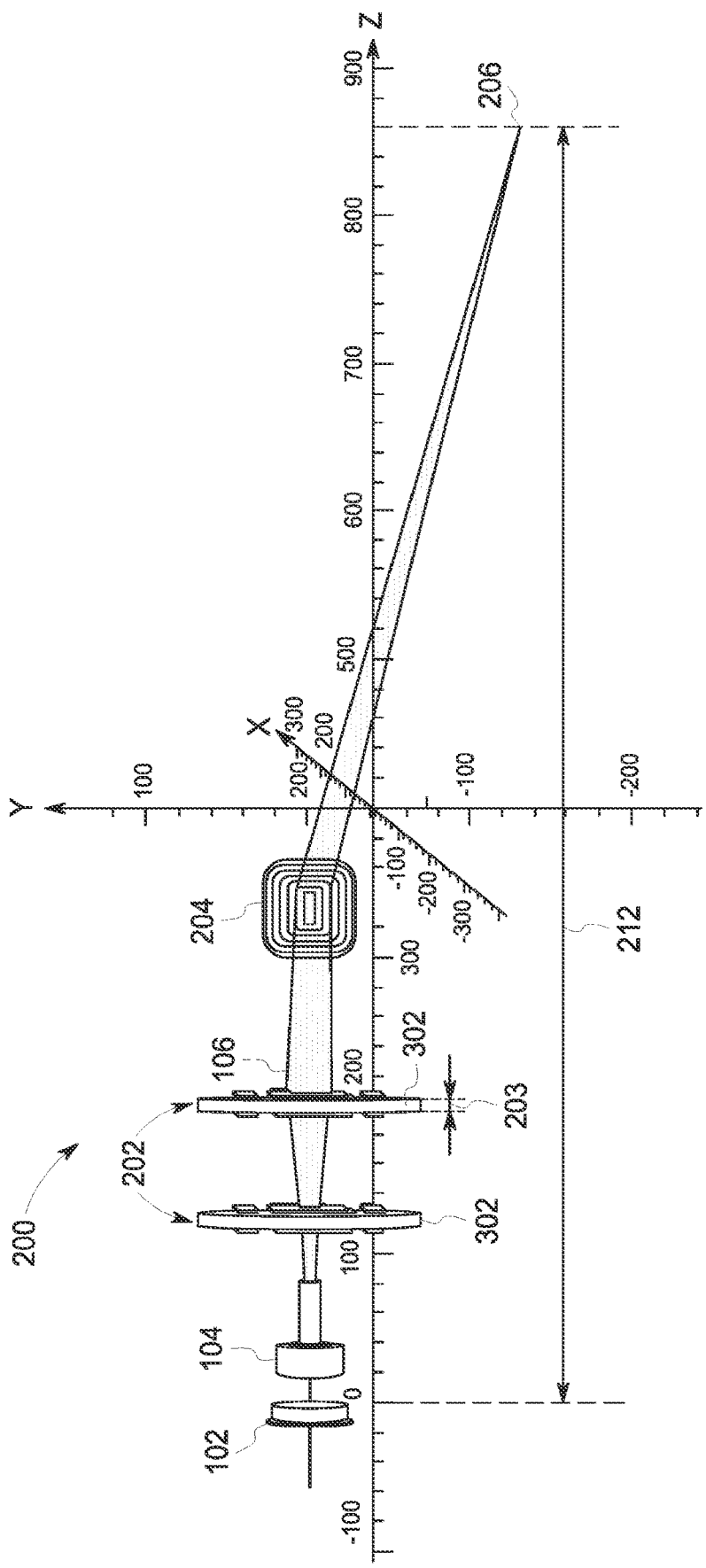
FIG. 2A is a schematic diagram of an exemplary EBM system according to the systems and methods disclosed herein.
Figure 2B:
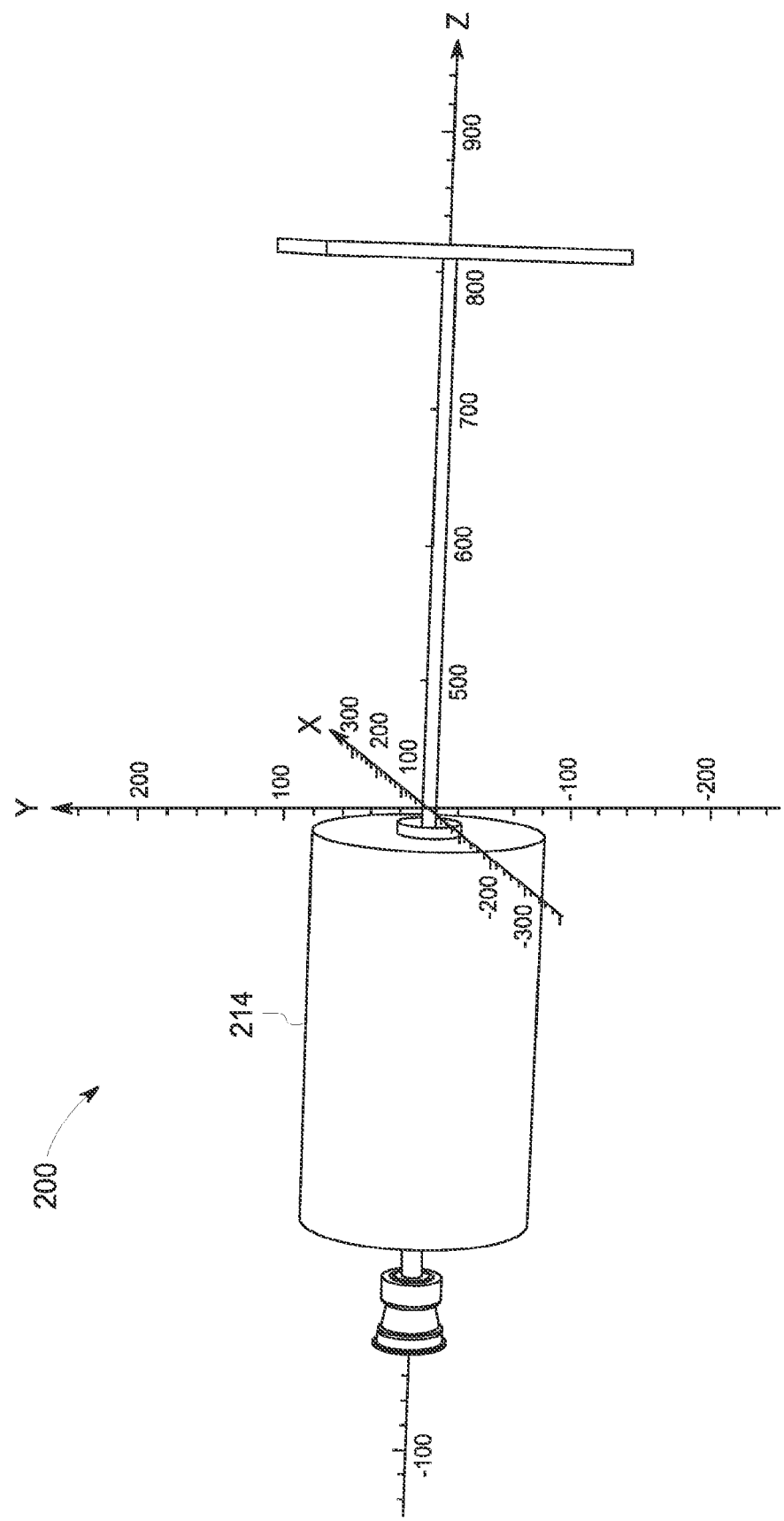
FIG. 2B is a schematic diagram of the EBM system shown in FIG. 2A including a shielding.

FIGS. 2A and 2B are schematic diagrams of an exemplary EBM system 200. FIG. 2A shows the EBM system 200 without a shielding 214, and FIG. 2B shows the EBM system 200 with the shielding 214. Besides the cathode 102 and the anode 104, the system 200 further includes a focus coil assembly 202. The focus coil assembly 202 is configured to focus the electron beam 106 generated by the cathode 102 and the anode 104. The depicted focus coil assembly 202 includes two quadrupole magnets 302. The thickness 203 of the quadrupole magnet 302 along the z-axis may be less than 10 mm, with similar operational parameters as the known focus coil assembly 108, in which the focal length is approximately 750 mm for focusing an electron beam having energy of 60 keV with an operation current of 3 A. In some embodiments, the thickness 203 is approximately 8 mm. In some embodiments, the system 200 may include one quadrupole magnet 302, three quadrupole magnets 302, or any other number of quadrupole magnets 302 that enables the system 200 to function as disclosed herein. The system 200 further includes a deflection coil 204 configured to steer the electron beam 106 to travel to the vacuum chamber (not shown).

In the exemplary embodiment, the system 200 may further include the shielding 214 that surrounds the focus coil assembly 202 and the deflection coil 204 (see FIG. 2B). The shielding 214 may be a cylindrical metal housing having a hole at each end that allows the electron beam 106 to enter into and exit from the shielding 214. The shielding 214 may be in other shapes that enable the system 200 to function as disclosed herein. The shielding 214 protects the electron beam 106 from interference from nearby magnetic materials, such as motors. The shielding 214 also further limits stray field from spreading into the space outside the shielding 214.

In operation, the electron beam 106 is generated by the cathode 102 and the anode 104, and travels along the z-axis to the focus coil assembly 202. The focus coil assembly 202 focuses the electron beam 106 to have a circular or near circular profile in the x-y plane. The electron beam 106 then is steered by the deflection coil 204 and travels to the vacuum chamber at a focused position 206 where a build plate (not shown) is located. For comparison, the distance between the deflection coil 110, 204 to the build plate/the focused position 114, 206 are kept the same, for systems 100 and 200. Compared to the system 100, the distance 212 that the electron beam 106 travels is approximately 860 mm in the system 200, which is reduced by approximately 100 mm from the distance 112 for the system 100. Thus, the size of the system 200 is greatly reduced as compared to the system 100. The reduced beam travel distance 212 is enabled by the compact design of the quadrupole magnets 302 and the focus coil assembly 202 and reduced cross-talking between the quadrupole magnet 302 of the focus coil assembly 202 and the deflection coil 204.

In some embodiments, the system 200 may further include a stigmator (not shown) configured to reduce astigmatism of the electron beam 106, where the electron beam 106 has more than one focus point. The stigmator may be aligned with the focus coil assembly 202 and the deflection coil 204 along the z-axis, and positioned between the focus coil assembly 202 and the deflection coil 204.

The focus coil assembly 202, the deflection coil 204, and the stigmator may be generally referred to an electron beam manipulation coil. In some embodiments, the system 200 further includes a control circuit that controls current flow through the electron beam manipulation coil. The control circuit includes an interface configured to receive the electron beam manipulation coil. The control circuit further includes a first switching device, a second switching device, and a third switching device. The first switching device is coupled to a first voltage source and is configured to create a first current path with the first voltage source toward the electron beam manipulation coil. The second switching device is coupled to a second voltage source and is configured to create a second current path with the second voltage source toward the electron beam manipulation coil. The third switching device is coupled to a first side of the interface and is configured to allow conductance via the first current path and the second current path to the interface when the third switching device is in a closed position. The second and third switching devices are configured to create a third current path with the second voltage source when in respective open positions, the third current path having an opposite polarity with respect to the second current path. Related control circuits applicable to the present disclosure are described in greater detail in U.S. Pat. No. 8,712,015, which is incorporated herein by reference in its entirety.

In some embodiments, the system 200 further includes an inverse pulse control for eddy current abatement. Related inverse pulse controls applicable to the present disclosure are described in greater detail in U.S. Pat. No. 8,625,743, which is incorporated herein by reference in its entirety.

Figure 3A:
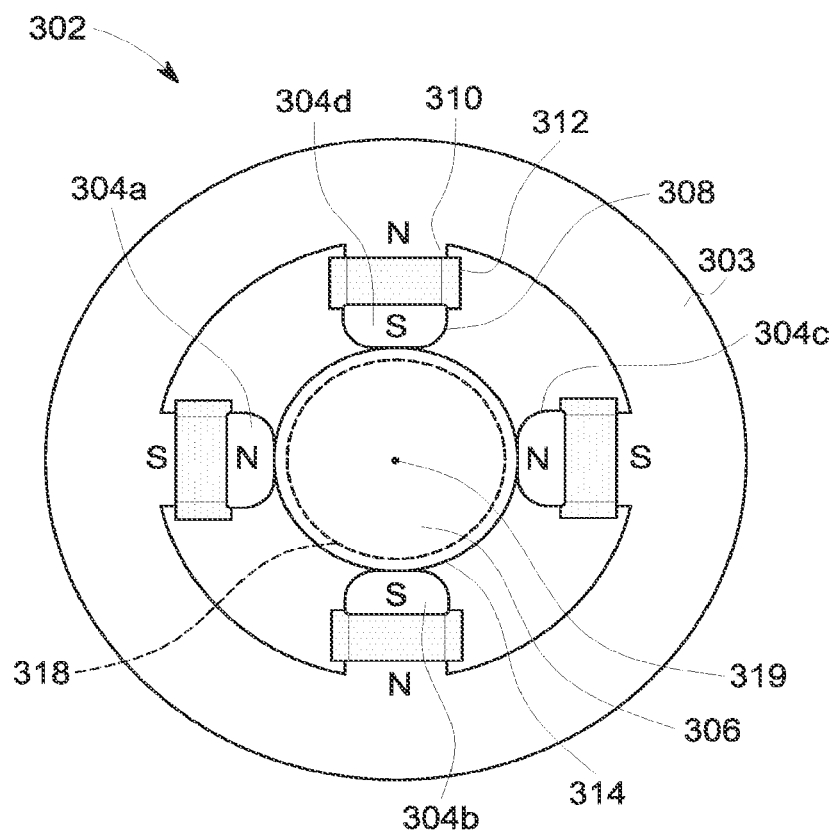
FIG. 3A is a cross-sectional view of an exemplary quadrupole magnet that may be used with the EBM system shown in FIG. 2A.
Figure 3B:
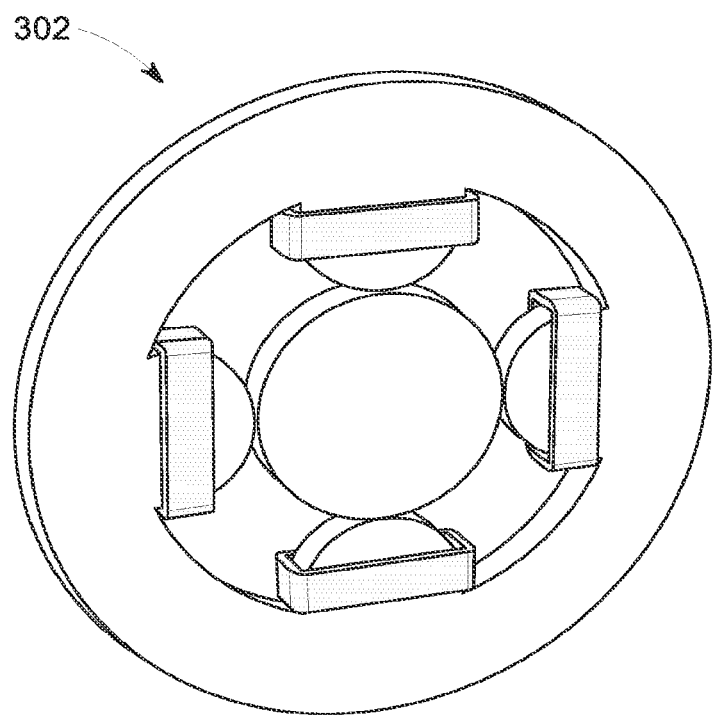
FIG. 3B is a perspective view of the quadrupole magnet shown in FIG. 3A.
Figure 3C:
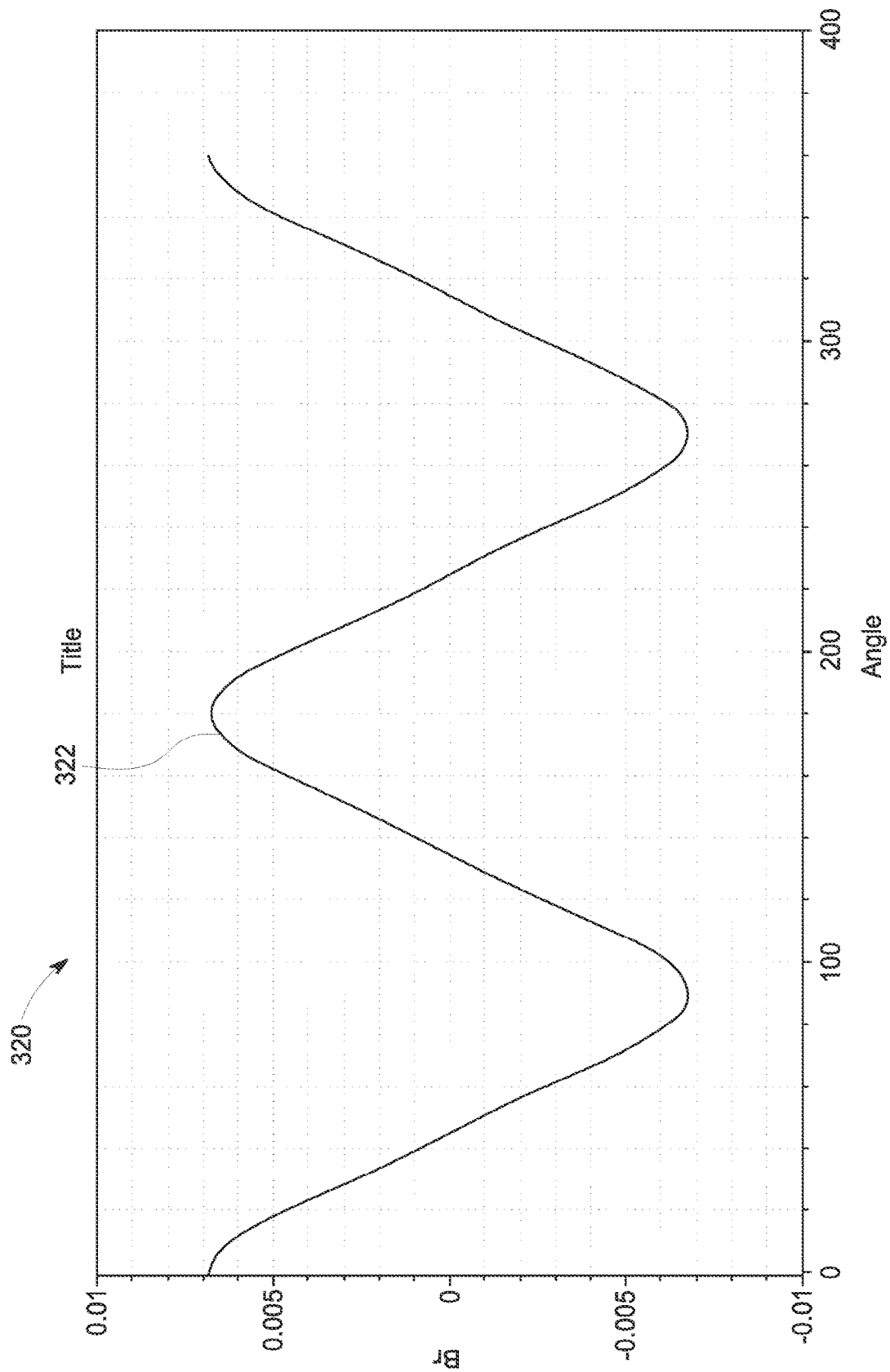
FIG. 3C is a plot of a magnetic field generated by the quadrupole magnet shown in FIG. 3A.

FIGS. 3A and 3B show an exemplary embodiment of the quadrupole magnet 302 that may be used with the system 200. FIG. 3A is a front view of the quadrupole magnet 302, depicted as in the x-y plane. FIG. 3B is a perspective view of the quadrupole magnet 302. FIG. 3C is a plot 320 of the magnetic field of the quadrupole magnet 302.

In the exemplary embodiment, the quadrupole magnet 302 includes four magnetic poles 304a, 304b, 304c, 304d. Poles 304a-304d may be referred to as a set of quadrupoles 304a-304d. The poles 304a-304d surround a beam cavity 306 through which the electron beam 106 travels. Each of the poles 304a-304d includes a pole face 308 that faces the beam cavity 306 and an end 310 opposite the pole face 308. The shape of the pole face 308 is convex in the exemplary embodiment. Poles 304a, 304c are positioned substantially along the x-axis and face each other at their respective pole faces 308. Poles 304b, 304d are positioned substantially along the y-axis and face each other at their respective pole faces 308.

In the exemplary embodiment, quadrupole magnets 302 are electromagnets, and quadrupole magnets 302 further include wires 312 winding around the poles 304a-304d. To generate a magnetic field, current is run through the wires 312. In some embodiments, the quadrupole magnets are permanent magnets. In the exemplary embodiment, poles 304a, 304c are both configured to have a first magnetic polarity at their respective pole faces 308, while poles 304b, 304d are both configured to have a second magnetic polarity opposite the first magnetic polarity at their respective pole faces 308. For each pole 304a-304d, the pole face 308 and the end 310 each have opposite magnetic polarities. For example, for poles 304a and 304c, their pole faces 308 have a magnetic polarity of north, and their ends 310 have a magnetic polarity of south. In contrast, for poles 304b and 304d, their pole faces 308 have a magnetic polarity of south, and their ends 310 have a magnetic polarity of north. As a result, the quadrupole magnets 302 generate a quadrupole magnetic field. The magnetic polarity of the poles 304a-304d may be changed by changing the direction of current flowing through the wires 312. Further, the strength of the magnetic field generated by the wires 312 may be controlled and adjusted by adjusting the current and/or the number of windings of wires around poles 304a-304d. Once the quadrupole magnet 302 has been manufactured, it may be difficult to change the number of windings without taking the quadrupole magnet 302 apart, but the strength of the magnetic field may be adjusted by adjusting the current flowing through the wires 312.

In some embodiments, the quadrupole magnet 302 may be configured as a deflection coil 204, in which quadrupole magnets 302 are configured to generate a dipole field. For example, in such a configuration, two neighboring poles have a first magnetic polarity at their pole faces 308 and the other two neighboring poles have a second magnetic polarity opposite the first magnetic polarity at their pole faces 308. In another example, the current flowing through wires 312 for one pair of opposite facing poles is turned off, with the other pair of opposite facing poles having different magnetic polarities at their respective pole faces 308.

The system 200 may further include a stigmator. In some embodiments, besides quadrupole magnets 302 in the focus coil assembly 202, the system 100 further includes an additional quadrupole magnet 302 configured as a stigmator, where the quadrupole magnet 302 is oriented approximately 45° about the z-axis relative to the quadrupole magnet 302 in the focus coil assembly 202. In other embodiments, the stigmator includes an octupole magnet (not shown). Compared to the quadrupole magnet 302, which includes four poles 304a-304d, the octupole magnet includes eight poles or two sets of quadrupoles 304a-304d, with one set of quadrupoles 304a-304d oriented approximately 45° about the z-axis relative to the other set of quadrupoles 304a-304d. When an octupole magnet is used as a stigmator, the system 200 may include a quadrupole magnet 302 for focusing and an octupole magnet for astigmatism control.

In the exemplary embodiment, the quadrupole magnet 302 further includes a yoke 303. To form a quadrupole magnet, the yoke 303 is coupled to the poles 304a-304d at the ends 310 of poles 304a-304d. The yoke 303 has a circular shape, which may be advantageous because a circular yoke 303 provides a uniform cross section, allowing a maximum area for magnetic flux, and reduces or eliminates magnetic flux concentration around the corners of a square or rectangular yoke 503 (see FIG. 5A), where such magnetic flux concentrations affect the focus strength of the quadrupole magnet 502 (see FIG. 5A) and create temperature hot spots in the yoke 503. Further, compared to a square or rectangular yoke 503, a circular yoke 303 is relatively easy to manufacture, reducing the manufacturing cost.

The yoke 303 is made of material that has a relatively high electrical resistivity and relatively high magnetic permeability. For example, at a room temperature, the resistivity of the material for the yoke 303 may be approximately $6 \times 10^{-7}$ ohm·metre ($\Omega \cdot m$), which is 35 times higher than the resistivity of $1.7 \times 10^{-8}$ $\Omega \cdot m$ for copper. Permeability indicates the degree of magnetization that a material contains in response to an applied magnetic field. Compared to air, the permeability of the material for the yoke 303 is at least several hundred times to several thousand times higher such that the magnetic flux is contained in the yoke 303. For example, if the relative permeability of air is 1, the relative permeability of the material for the yoke 303 is more than 1500 at a zero background field. Further, the relatively high electrical resistivity limits eddy currents caused by changes in the magnetic field. Eddy currents are opposite to the changes in the magnetic field and therefore reduce the generated magnetic field and the slew rate or the speed of switching the magnetic field up or down.

The yoke 303 may be made of laminated material, for example, laminated silicon iron. Laminated yoke material further increases the electrical resistivity of the material along the z-axis direction. In some embodiments, the yoke 303 is formed with a plurality of metallic layers with a nonmetallic layer such as an epoxy positioned in between pairs of metallic layers and acting as an insulation layer. The plurality of metallic layers may be stacked along the z-axis. The nonmetallic layer serves as a barrier to eddy currents. With eddy currents reduced, the slew rate of transitioning the magnetic field is increased. Further, power loss during current transitions is reduced and a reduced current is needed to generate the same amount of magnetic field, which then reduces the demand on a current amplifier (not shown) that supplies current to the quadrupole magnet 302, therefore reducing the cost of the amplifier and the system 200. The number of metallic layers may be, for example, from ten to twenty layers. The thickness of the metallic layer may be approximately 1.27 mm (i.e., 1/20 inch). In one example, the yoke 303 is made of powder iron cores such as a molypermalloy powder (MPP), which is a mixture of iron powder with epoxy and other materials. In another example, the yoke 303 is made of soft ferrites, which are ceramic materials made by mixing iron oxide, metallic elements, or carbonates of metals such as manganese, zinc, nickel, or cobalt. Ferrites may be used for high-frequency applications.

In operation, using the yoke 303, the magnetic field is relatively contained within the focus coil assembly 202, and the magnetic flux is contained in the yoke 303 due to the relatively high permeability of the yoke 303. With the magnetic flux contained within the focus coil assembly 202, because of the effect of the yoke 303 on the pole face 308, the magnetic field is concentrated at the pole faces 308 near where the electron beam 106 travels, and the magnetic field applied to the electron beam 106 is greatly increased, as compared to a solenoid focus coil assembly (e.g., the solenoid focus coil assembly 108 in system 100) with the same dimensions. As a result, the size of the focus coil assembly 202 in the system 200 can be much less than a solenoid focus coil assembly. For example, the length of the focus coil assembly 202 in the z-axis may be approximately 10 mm plus the separation between quadrupole magnets, which may vary, as compared to the length of the solenoid focus coil assembly 108 being on the order of 100 mm. Further, compared to the known focus coil assembly 108, the focus coil assembly 202 disclosed herein has improved performance. The focus coil assembly 202 has an increased slew rate due to the reduced inductance and reduced resistance.

FIG. 3C shows a plot 320 of the magnetic field generated by the quadrupole magnet 302, measured along a circle 318 having a radius of 20 mm from the center 319 of the quadrupole magnet 302. In the plot 320, the magnetic field is plotted as a function of the angle ($\theta$) of the measuring location on the circle 318 relative to the positive x-axis, in other words, the angle between i) the line formed by the center 319 and the measuring location and ii) the positive x-axis. In FIG. 3C, the curve 322 of the magnetic field in the plot 320 is smooth and resembles a function of cos 2$\theta$, which is the magnetic field of an ideal quadrupole magnet. A curve 322 resembling the ideal function may be achieved by procedures such as changing the shape of pole faces 308, the ratio of width over length of the pole 304a-d, and the location of wires 312 on the pole 304a-d. The smoothness of the curve 322 occurs because of the convex pole face 308. A magnetic field having a smooth curve 322 causes less distortions in the electron beam 106 than a more turbulent magnetic field (see FIG. 5B).

Because molecules in the air scatter the electron beam 106, in an EBM system 100, 200, the electron beam 106 travels in vacuum instead. Accordingly, in the embodiments described herein, a vacuum tube 314 is used to enclose the beam 106. The vacuum tube 314 may extend from the end of the beam tunnel 107 of the anode 104 to the end of the deflection coil 204 for the system 200 (FIG. 2A). In at least some known systems, the vacuum tube is made of ceramic, which is relatively expensive and difficult to manufacture due to the manufacturing process of ceramic. Accordingly, in the exemplary embodiment, the vacuum tube 314 is made of metal, which is much cheaper and easier to manufacture than the traditional ceramic tube. The vacuum tube 314 also tolerates heat cycling better than a ceramic vacuum tube.

In operation, when the electron beam 106 travels through the beam cavity 306, the quadrupole magnetic field generated by the quadrupole magnets 302 exerts a force on the electron beam 106 and adjusts the profile of the electron beam 106 in the x-y plane from an elliptical profile to a more circular profile.

Figure 4A:
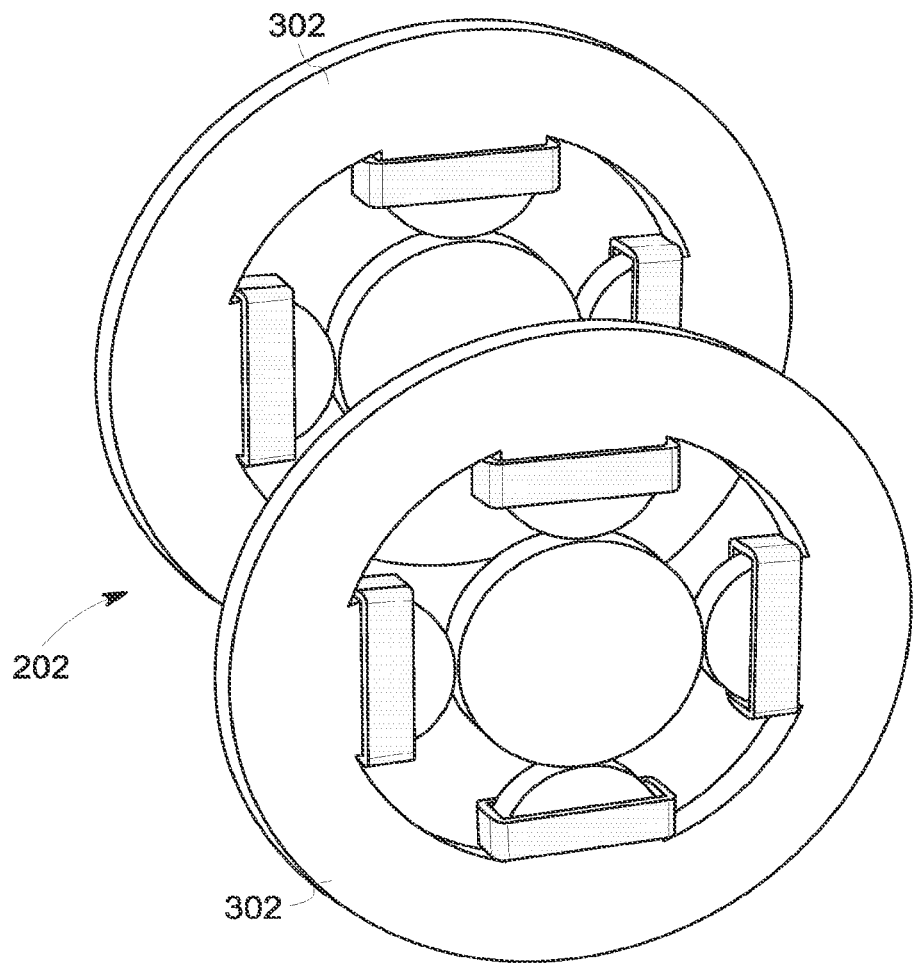
FIG. 4A is a schematic diagram showing a focus coil assembly having two of the quadrupole magnets shown in FIG. 3A.

Because of the modular configuration of the quadrupole magnet 302, the EBM system 200 may include a focus coil assembly having two or more quadrupole magnets 302 to improve the profile of the electron beam 106. In some embodiments, the focus coil assembly 202 includes two quadrupole magnets 302 (see FIGS. 2 and 4A). The poles 304a-304d of the two quadrupole magnets 302 are oriented 90 degrees about the z-axis relative to each other. In one example, one quadrupole magnet 302 is rotated 90 degrees about the z-axis relative to the other quadrupole magnet 302. In another example, poles on each quadrupole magnet 302 that are aligned along the z-axis have opposite polarities from one another. The 90-degree rotation of the magnetic polarity may be accomplished by changing the direction of current flowing through the wires 312 wound around the poles 304a-304d. When a pair of quadrupole magnets 302 are used in a focus coil assembly 202, the current flowing through the quadrupole magnets 302 for generating a magnetic field may have substantially the same amplitude. In one example, current flowing through the first and second quadrupole magnets 302 is held in a substantially fixed ratio to one another during operation such that the shape of the focal spot on the target remains substantially constant when the current through the quadrupole magnets is changed. Related pairs of quadrupole magnets having current of a fixed ratio applicable to the present disclosure are described in greater detail in U.S. Pat. No. 9,153,409, which is incorporated herein by reference in its entirety.

Figure 4B:
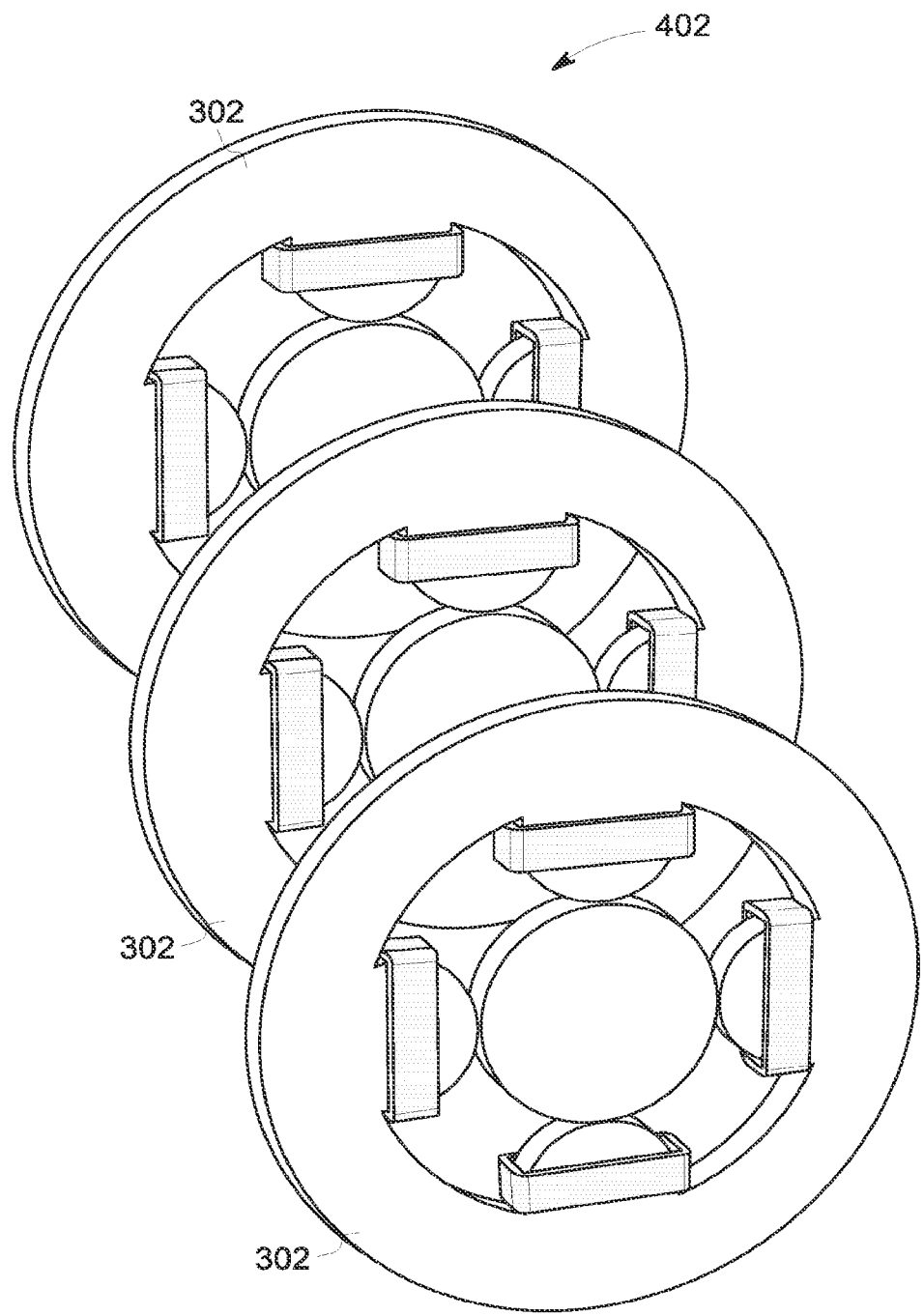
FIG. 4B is a schematic diagram showing a focus coil assembly having three of the quadrupole magnets shown in FIG. 3A.

In other embodiments, three quadrupole magnets 302 are used in a focus coil assembly 402 (see FIG. 4B). In the embodiment shown, the poles 304a-304d of the second quadrupole magnet 302 are oriented 90 degrees about the z-axis relative to the first and third quadrupole magnets 302. The magnetic fields generated by the current provided to the first and third quadrupole magnets 302 may have substantially the same magnetic field strength as each other and approximately half of the magnetic field strength of the magnetic field generated by the current provided to the second quadrupole magnet 302, in order to achieve a relatively circular profile for the electron beam 106.

In addition, the modular configuration of the quadrupole magnet 302 reduces the complexity and different types of parts needed to assemble the system 200 by configuring the quadrupole magnet 302 as a deflection coil 204 in the system 200. Two or more deflection coils 204 may be included in the EBM system 200 to adjust the direction of the electron beam 106 by positioning the deflection coil 204 at needed locations along the beam axis.

Figure 5A:
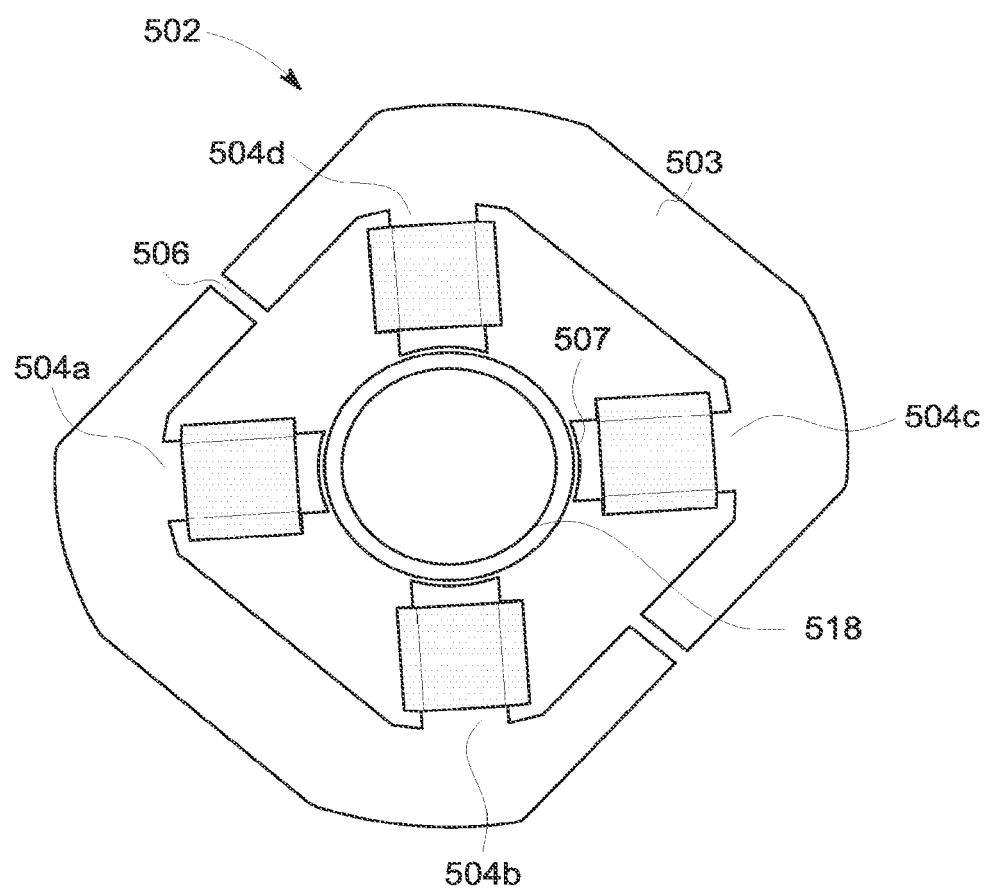
FIG. 5A is a cross-sectional view of another exemplary quadrupole magnet that may be used with the EBM system shown in FIG. 2A.
Figure 5B:
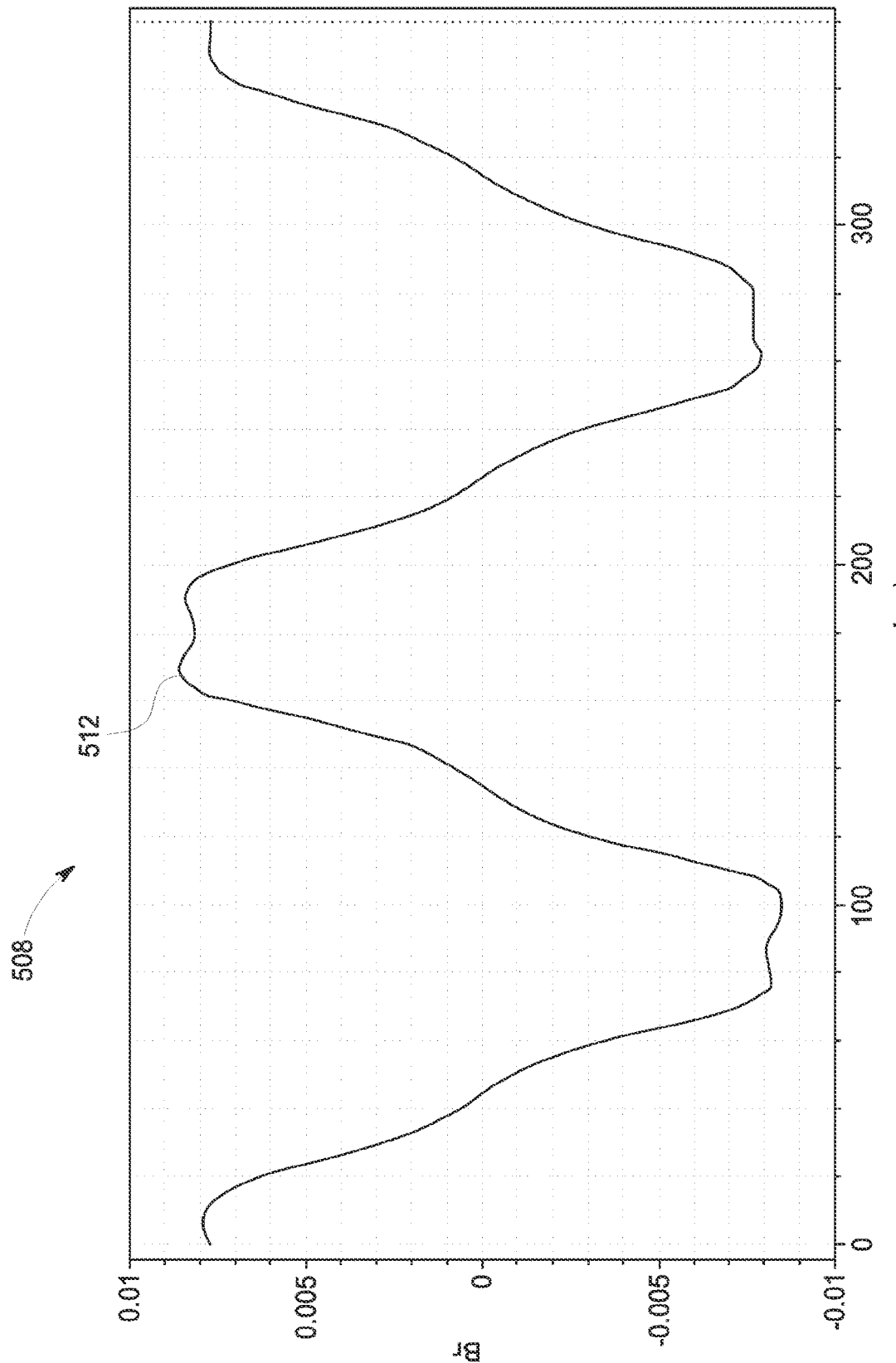
FIG. 5B is a plot of the magnetic field generated by the quadrupole magnet shown in FIG. 5A.

FIG. 5A shows another exemplary quadrupole magnet 502. Compared to the quadrupole magnet 302, the yoke 503 of the quadrupole magnet 502 has an angled, somewhat rectangular shape, and the pole faces 507 of poles 504a-504d are concave. FIG. 5B illustrates a plot 508 of the magnetic field of the quadrupole magnet 502 measured around a circle 518. Similar to the plot 320, in the plot 508, the magnetic field is plotted as a function of the angle of the measuring location on the circle 518 relative to the positive x-axis. Comparing the plot 508 to the plot 320 for the quadrupole magnet 302, the curve 510 in the plot 508 is not as smooth as the curve 322 in the plot 320, and resembles the function $\cos 2\theta$ less than the curve 322. The bumps and deviations 512 in the curve 510 create distortion in the profile of the electron beam 106.

The Quadrupole magnet 302, 502 may be manufactured in two halves, with gaps 506 formed between the halves. The gaps 506 of the quadrupole magnet 502 are formed between neighboring poles. The gaps 506 of the quadrupole magnet 302 (not shown in FIGS. 3A, 3B, 4A and 4B) are formed adjacent the poles 304a-304d. The quadrupole magnets 302, 502 may be held together by clamps bridging the gaps 506 in some embodiments.

Figure 6A:
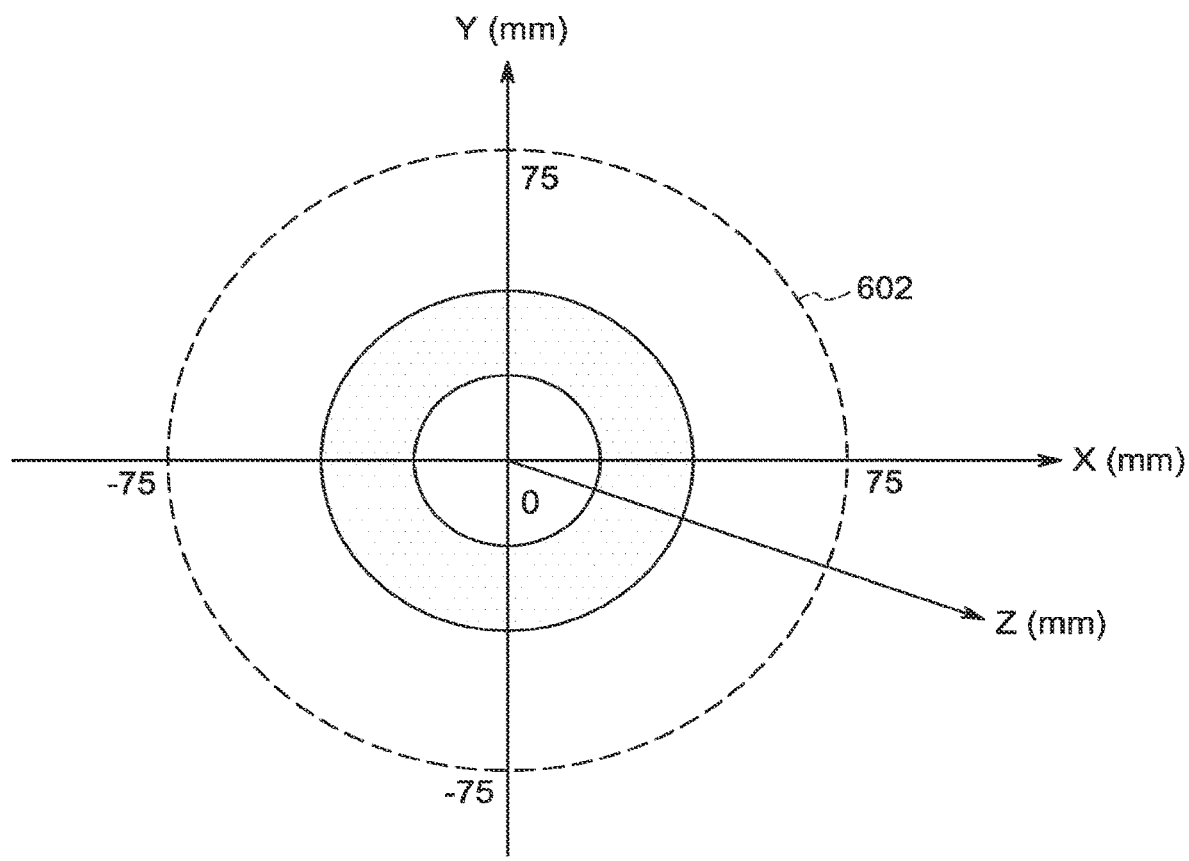
FIG. 6A is a schematic diagram illustrating measurement of a stray field of a known focus coil assembly in the EBM system shown in FIG. 1.
Figure 6B:
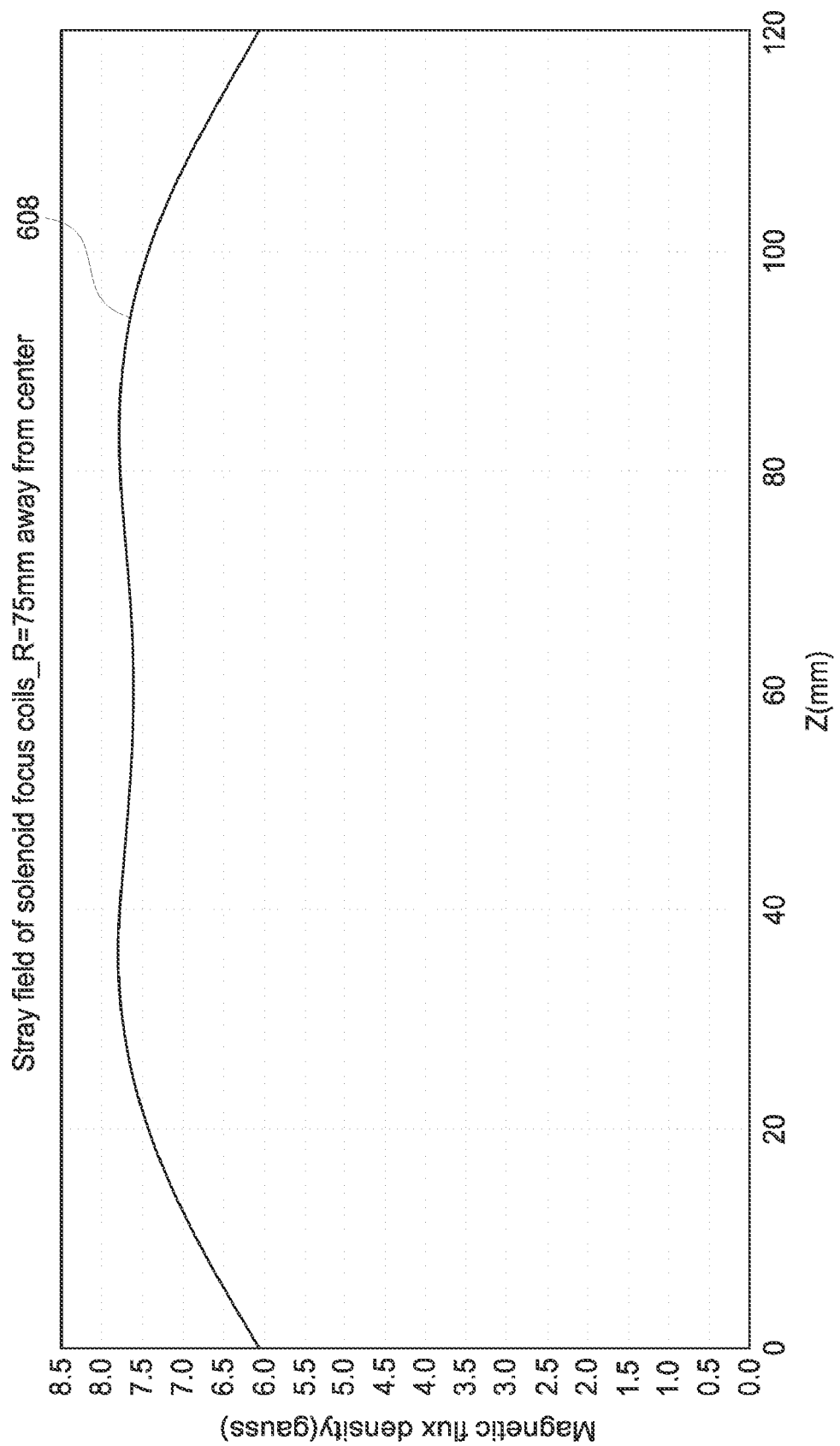
FIG. 6B is a plot showing the measured stray field of the known focus coil assembly in the EBM system shown in FIG. 1.
Figure 6C:
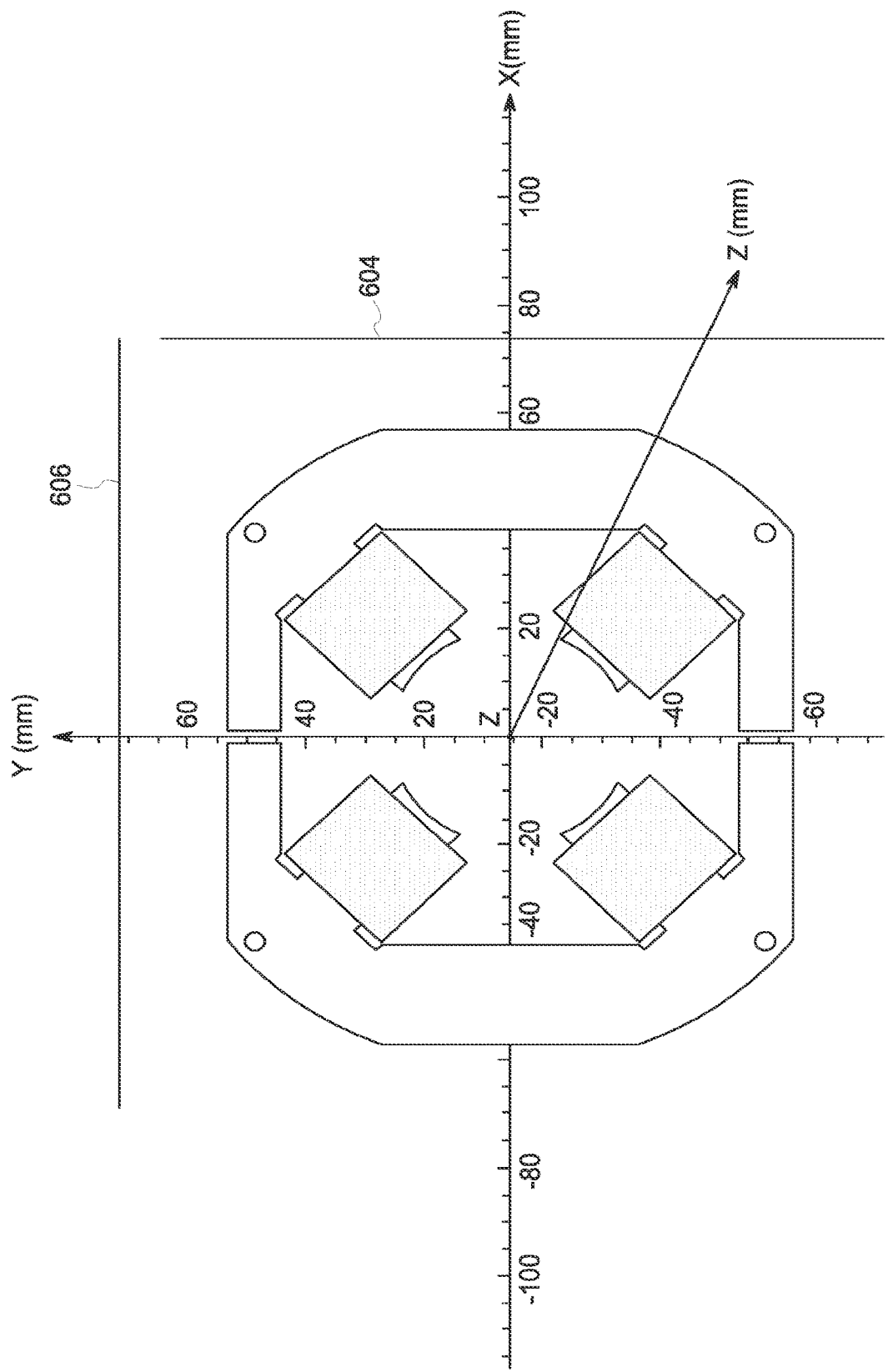
FIG. 6C is a schematic diagram illustrating measurement of a stray field of the quadrupole magnet shown in FIG. 5A.
Figure 6D:
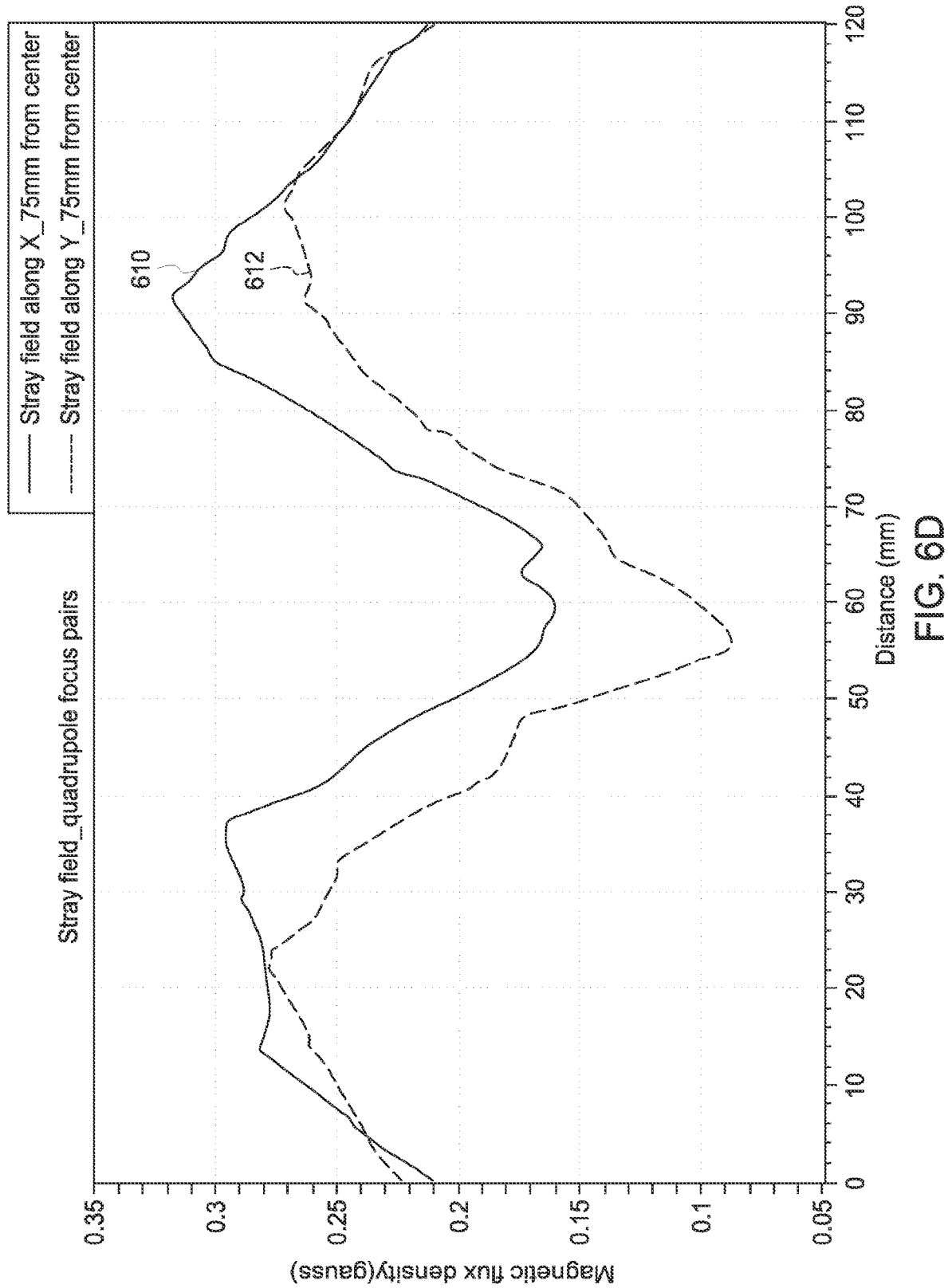
FIG. 6D is a plot showing the measured stray field of the quadrupole magnet shown in FIG. 5A.

FIGS. 6A-6D show the stray field of the solenoid focus coil assembly 108 (FIGS. 6A and 6B) as compared to the stray field of the focus coil assembly 202 including the quadrupole magnet 502 (FIGS. 6C and 6D). The stray field is the magnetic field present outside the associated focus coil assembly. For comparison, the stray field is measured at 75 mm away from the center of the focus coil assembly 108 or from the center of the quadrupole magnet 502 in the x-y plane as a function of the distance from the center in the z-axis direction. For solenoid focus coil assembly 108, the stray field is measured along a cylinder 602 that has a radius of 75 mm in the x-y plane (FIG. 6A). For the focus coil assembly 202, the stray field is measured along a plane 604 that is parallel to the z-axis and perpendicular to the x-axis at x=75 mm or a plane 606 that is parallel to the z-axis and perpendicular to the y-axis at y=75 mm (FIG. 6C). FIGS. 6B and 6D show the stray field measurements. In FIG. 6B, the stray field (line 608) of the solenoid focus coil assembly 108 is in the order of 6 gauss, while the stray field (lines 610, 612) of the focus coil assembly 202 is in the order of 0.25 Gauss, an approximately 24-fold reduction. As a result, the quadrupole magnets 302, 502 may be placed close to each other and form a more compact focus coil assembly 202 than the solenoid focus coil assemblies 108, thereby reducing the size of the EBM system 200.

At least one technical effect of the systems and methods described herein includes (a) significantly reducing stray field from the focus coil assembly; (b) reducing eddy current in the focus coil assembly; (c) reducing dimensions of the focus coil assembly and the EBM system; (d) facilitating straightforward configurations of multiple focus coil assemblies and/or multiple deflection coils in the EBM system due to the modular configuration of the quadrupole magnets; (e) increasing flexibility in system configuration and reducing a number of parts in the system because a focus coil assembly may be used as a deflection coil; (f) providing shielded focus coil assemblies and deflection coils that protect the electron beam from exterior interference; and (g) reducing cost and manufacturing complexity of a metal vacuum tube for containing the electron beam.

Exemplary embodiments of systems and methods of focusing and steering an electron beam are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A focus coil assembly for melting, sintering, or heat treating a material, comprising:
    a quadrupole magnet comprising:
        first, second, third, and fourth poles spaced apart from each other and surrounding a beam cavity through which an electron beam travels, each of said first, second, third, and fourth poles comprising a pole face proximate the beam cavity and an end opposite said pole face, said first and third poles aligned along an x-axis and configured to have a first magnetic polarity at their respective pole faces and a second magnetic polarity opposite the first magnetic polarity at their respective ends, said second and fourth poles aligned along a y-axis and configured to have the second magnetic polarity at their respective pole faces and the first magnetic polarity at their respective ends, wherein the x-axis is perpendicular to the y-axis; and
    a yoke surrounding said first, second, third, and fourth poles and coupled to said first, second, third, and fourth poles at said ends of said first, second, third, and fourth poles.

2. The focus coil assembly of claim 1, wherein said yoke further comprises a plurality of metallic layers stacked along a z-axis perpendicular to the x-axis and the y-axis, a non-metallic layer positioned between each pair of the plurality of metallic layers.

3. The focus coil assembly of claim 1, wherein said yoke has a relatively high electrical resistivity and relatively high magnetic permeability.

4. The focus coil assembly of claim 1, wherein each of said pole faces of said first, second, third, and fourth poles is convex.

5. The focus coil assembly of claim 1, wherein said yoke is circular.

6. The focus coil assembly of claim 1, wherein said quadrupole magnet has a thickness along a z-axis of less than 10 millimeter (mm), the z-axis perpendicular to the x-axis and the y-axis.

7. The focus coil assembly of claim 1, wherein the resistivity of the yoke has a resistivity greater than a resistivity of copper.

8. The focus coil assembly of claim 1, wherein the yoke has a permeability at least 100 times greater than a permeability of air.

9. The focus coil assembly of claim 1, wherein the yoke has a permeability of at least 1500 at a zero background field.

10. A deflection coil for electron beam additive manufacturing, comprising:
   a quadrupole magnet comprising:
      first, second, third, and fourth poles spaced apart from each other and surrounding a beam cavity through which electron beam travels, each of said first, second, third, and fourth poles having a pole face proximate the beam cavity and an end opposite said pole face, said first and third poles positioned along an x-axis, said second and fourth poles positioned along a y-axis, wherein the x-axis is perpendicular to the y-axis; and
      a yoke surrounding said first, second, third, and fourth poles and coupled to said first, second, third, and fourth poles at said ends of said first, second, third, and fourth poles, wherein said quadrupole magnet is configured to generate a dipole magnetic field.

11. The deflection coil of claim 10, wherein the yoke is circular.

12. The deflection coil of claim 10, wherein the resistivity of the yoke has a resistivity greater than a resistivity of copper.

13. The deflection coil of claim 10, wherein the yoke has a permeability at least 100 times greater than a permeability of air.

14. The deflection coil of claim 10, wherein the yoke has a permeability of at least 1500 at a zero background field.

15. The deflection coil of claim 10, wherein the yoke is formed from a laminated material.

16. The deflection coil of claim 15, wherein the laminated material is silicon iron.

17. The deflection coil of claim 15, wherein the yoke comprises a plurality of metallic layers with nonmetallic layers positioned between adjacent metallic layers.

18. The deflection coil of claim 17, wherein the yoke comprises from ten to twenty metallic layers.

19. The deflection coil of claim 10, wherein the yoke comprises powder iron cores.

20. The deflection coil of claim 10, wherein the yoke comprises soft ferrites.

* * * * *